United States Patent
Ikezaki

(10) Patent No.: US 7,538,550 B2
(45) Date of Patent: May 26, 2009

(54) MAGNETIC RESONANCE IMAGING APPARATUS, MAGNETIC RESONANCE IMAGING METHOD, SCAN APPARATUS, PROGRAM AND STORAGE MEDIUM

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 12 days.

(21) Appl. No.: 11/867,507

(22) Filed: Oct. 4, 2007

(65) Prior Publication Data
US 2008/0084208 A1 Apr. 10, 2008

(30) Foreign Application Priority Data
Oct. 6, 2006 (JP) .............................. 2006-275386

(51) Int. Cl.
*G01V 3/00* (2006.01)
(52) U.S. Cl. .................. 324/312; 324/307; 324/309
(58) Field of Classification Search ......... 324/300–322; 600/410–435; 702/66, 79, 97, 106, 124
See application file for complete search history.

(56) References Cited

U.S. PATENT DOCUMENTS

| | | | |
|---|---|---|---|
| H001968 H * | 6/2001 | Bernstein .................... 600/410 |
| 6,307,368 B1 | 10/2001 | Vasanawala et al. |
| 6,400,151 B1 * | 6/2002 | Haase et al. ................. 324/309 |
| 6,493,569 B2 | 12/2002 | Foo et al. |
| 6,750,651 B2 | 6/2004 | Overall |
| 6,806,709 B2 | 10/2004 | Markl et al. |
| 6,922,054 B2 | 7/2005 | Hargreaves et al. |
| 7,009,395 B2 | 3/2006 | Dixon et al. |
| 7,012,428 B1 | 3/2006 | Ward et al. |
| 7,078,903 B2 | 7/2006 | Paliwal et al. |
| 7,096,056 B2 | 8/2006 | Miller et al. |
| 7,253,620 B1 | 8/2007 | Derbyshire et al. |
| 7,446,526 B2 * | 11/2008 | Cunningham et al. ....... 324/307 |
| 2008/0231280 A1 * | 9/2008 | Greim et al. ................ 324/318 |

FOREIGN PATENT DOCUMENTS

| | | |
|---|---|---|
| JP | 2003-010148 | 1/2003 |
| JP | 2005065724 | 3/2005 |
| JP | 2006-122222 | 5/2006 |

OTHER PUBLICATIONS

Deshpande, et al.; Reduction of Transient Signal Oscillations in True-FISP Using a Linear Flip Angle Series Magnetization Preparation; Magnetic Resonance in Medicine; pp. 151-157; 2003.

* cited by examiner

*Primary Examiner*—Dixomara Vargas
(74) *Attorney, Agent, or Firm*—Armstrong Teasdale LLP

(57) ABSTRACT

With the objective of reducing the number of times that RF pulse are idle-shot during an idling time upon executing an SSFP pulse sequence by a phase cycling method and thereby performing imaging efficiently, the angle of the phase of each RF pulse is changed during the idling time so as to sequentially increase every time of repetition to a phase-increased angle at the time that the RF pulses are repeatedly transmitted at a scan executed after the idling time, thereby transmitting the RF pulses.

20 Claims, 5 Drawing Sheets

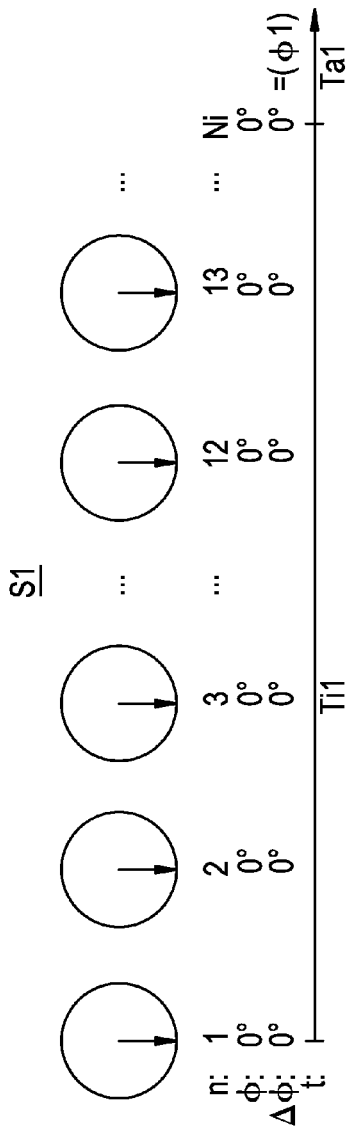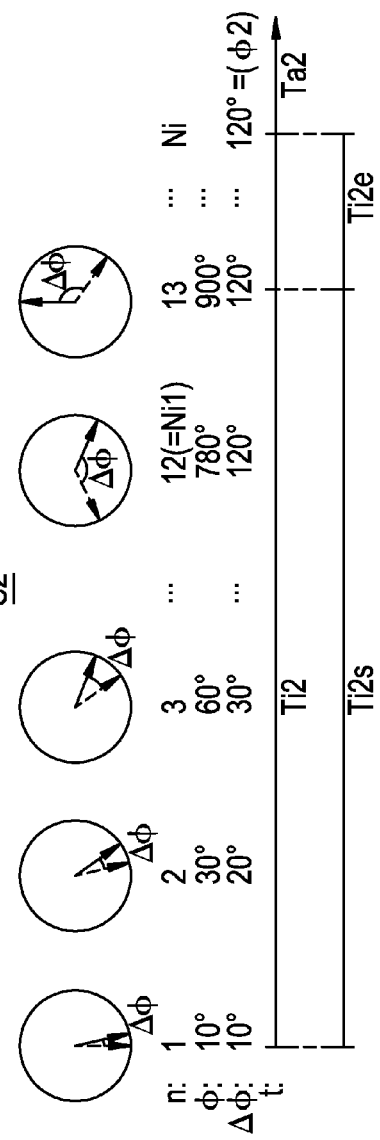

MAGNETIC RESONANCE IMAGING APPARATUS, MAGNETIC RESONANCE IMAGING METHOD, SCAN APPARATUS, PROGRAM AND STORAGE MEDIUM

CROSS REFERENCE TO RELATED APPLICATIONS

This application claims the benefit of Japanese Application No. 2006-275386 filed Oct. 6, 2006.

BACKGROUND OF THE INVENTION

The present invention relates to a magnetic resonance imaging (MRI) apparatus, a magnetic resonance imaging method, a scan apparatus, a program and a storage medium. The present invention relates particularly to a magnetic resonance imaging apparatus, a magnetic resonance imaging method, a scan apparatus, a program and a storage medium wherein a scan for, after the elapse of an idling time during which RF (Radio Frequency) pulses are repeatedly transmitted every time of repetition (TR) in such a manner that spins in an imaging area of a subject are respectively brought into an SSFP (Steady State Free Precession) state in a static magnetic field space, repeatedly transmitting the RF pulses every time of repetition to the imaging area in which each of the spins is brought into the SSFP state during the idling time, and receiving magnetic resonance signals generated at the imaging area, is executed plural times by a phase cycling method, and images about the imaging area are generated based on the magnetic resonance signals received by executing the scan plural times.

A magnetic resonance imaging apparatus excites spins in an imaging area of a subject in a static magnetic field space by a nuclear magnetic resonance (NMR) phenomenon, and generates images about the imaging area of the subject, based on magnetic resonance (MR) signals generated with the excitation thereof.

The magnetic resonance imaging apparatus has been used in various fields such as a medical field, an industrial field, etc. The imaging area of the subject has been photographed by various imaging or photographing methods according to photographic purposes. For example, as an imaging method used in the magnetic resonance imaging apparatus, there has been known an SSFP pulse sequence called an FISP (Fast Imaging with Steady-state Precession) or an FIESTA (Fast Imaging Employing Steady state Precession) (refer to, for example, a patent document 1).

In the SSFP pulse sequence, RF pulses are repeatedly transmitted to the imaging area of the subject in TR shorter than both of a vertical relaxation time and a horizontal relaxation time, and spins in the imaging area are respectively brought into an SSFP state. After magnetic resonance signals generated in the SSFP state have been received, images about the imaging area of the subject are generated based on the magnetic resonance signals. Here, respective gradient magnetic fields are applied in such a manner that the time integral values of the gradient magnetic fields applied in a slice selection direction, a phase encode direction and a frequency encode direction respectively are brought to zero within TR. That is, the phase shifted by each gradient magnetic field is reset by rewinding horizontal magnetization after acquisition of the magnetic resonance signals. Therefore, since the magnetic resonance signals including a FID (Free Induction Decay) signal and an echo signal are acquired in the present imaging method, signal strength is increased and hence the photography of each image having high contrast at high speed can be realized.

In the SSFP pulse sequence, however, band artifacts occur in the images due to the influence of magnetic-field nonuniformity and hence image quality might be deteriorated.

Therefore, there has been proposed a phase cycling method to suppress the occurrence of the band artifacts in the images (refer to, for example, a patent document 2).

[Patent Document 1] Japanese Unexamined Patent Publication No. 2003-10148

[Patent Document 2] Japanese Unexamined Patent Publication No. 2006-122222

FIG. 5 is a diagram showing phase-increased angles of transmitted RF pulses at scans executed by a phase cycling method. FIG. 5(a) shows the case of 2Nex, FIG. 5(b) shows the case of 3Nex, and FIG. 5(c) shows the case of 4Nex.

In the phase cycling method, as shown in FIG. 5, the angle (360°) of one circle is divided by the added number of times (Nex) to determine each phase-increased angle. The phase-increased angle is changed and the scan is executed plural times to obtain images at respective scans. Thereafter, the plural images are combined together to produce a combined image.

Described specifically, in the case of 2Nex, a first scan is first executed assuming that the phase-increased angle corresponding to the angle of each phase increased every TR is 0° as shown in FIG. 5(a). That is, RF pulses are repeatedly transmitted in such a manner that the phase of the RF pulse at each TR is sequentially transitioned or shifted to 0°, 0°, . . . to execute the first scan. Next, a second scan is executed assuming that the phase-increased angle is 180°. That is, RF pulses are repeatedly transmitted in such a manner that the phase of the RF pulse at each TR is sequentially transitioned to 0°, 180°, 360° (0°), 540° (180°), . . . to execute the second scan. Then, an image generated based on a magnetic resonance signal obtained by execution of the first scan and an image generated based on a magnetic resonance signal obtained by execution of the second scan are combined together.

In the case of 3Nex, RF pulses are first repeatedly transmitted in such a manner that the phase of the RF pulse at each TR is sequentially transitioned to 0°, 0°, . . . with the phase-increased angle as 0° as shown in FIG. 5(b), thereby to execute a first scan. Next, RF pulses are repeatedly transmitted in such a manner that the phase of the RF pulse at each TR is sequentially transitioned to 0°, 120°, 240°, 360°, . . . with the phase-increased angle as 120°, thereby to execute a second scan. Next, RF pulses are repeatedly transmitted in such a manner that the phase of the RF pulse at each TR is sequentially transitioned to 0°, 240°, 480° (120°), 720° (0°), . . . with the phase-increased angle as 240°, thereby executing a third scan. Thereafter, images generated based on magnetic resonance signals obtained by execution of the first, second and third scans are combined together.

In the case of 4Nex, RF pulses are first repeatedly transmitted in such a manner that the phase of the RF pulse at each TR is sequentially transitioned to 0°, 0°, . . . with the phase-increased angle as 0° as shown in FIG. 5(c), thereby to execute a first scan. Next, RF pulses are repeatedly transmitted in such a manner that the phase of the RF pulse at each TR is sequentially transitioned to 0°, 90°, 180°, 270°, 360°, . . . with the phase-increased angle as 90°, thereby to execute a second scan. Next, RF pulses are repeatedly transmitted in such a manner that the phase of the RF pulse at each TR is sequentially transitioned to 0°, 180°, 360° (0°), 540° (180°), 720° (0°), . . . with the phase-increased angle as 180°, thereby executing a third scan. Next, RF pulses are repeatedly transmitted in such a manner that the phase of the RF pulse at each TR is sequentially transitioned to 0°, 270°, 540° (180°), ... with the phase-increased angle as 270°, thereby executing a fourth scan. Thereafter, images generated based on magnetic resonance signals obtained by execution of the first, second, third and fourth scans are combined together.

In the respective images generated by the scans executed so as to correspond to the added number of times (Nex) at the phase cycling method as described above, the positions where the band artifacts occur are shifted from one another. Therefore, the occurrence of the band artifacts is suppressed at the combined image generated by combining the respective images together, and hence excellent image quality is realized.

However, when the respective scans are executed in the present imaging method, the phase of the RF pulse is changed in a manner similar to the above during the idling time prior to the acquisition of the magnetic resonance signals and the RF pulses are repeatedly transmitted every TR, in order to acquire or collect the magnetic resonance signals in the SSFP state in which each stable signal is obtained. Therefore, there was a case where imaging or photographing time would reach a long period of time. In the case of, for example, 2Nex, the RF pulses are repeatedly transmitted in such a manner that the phase of the RF pulse at each TR is sequentially transitioned to 0°, 180°, 360° (0°), 540° (180°), ... with the phase-increased angle of the RF pulse as 180° during the idling time at the execution of the second scan, thereby forming the SSFP states. In order to form the SSFP states, there is a need to idle-shot many RF pulses during the idling time. Therefore, the present imaging method might encounter difficulties in executing imaging or photography efficiently.

SUMMARY OF THE INVENTION

It is desirable that the problem described previously is solved.

In one aspect of the invention, there is provided a magnetic resonance imaging apparatus of the present invention that executes, by a phase cycling method plural times, a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every time of repetition to the imaging area in which each of the spins is brought into the SSFP state during the idling time, and receiving magnetic resonance signals generated at the imaging area, and that generates images about the imaging area, based on the magnetic resonance signals received by executing the scan plural times, which includes a scan section for executing the scan, wherein the scan section changes the angle of the phase of each RF pulse so as to sequentially increase every time of repetition to a phase-increased angle at the time that the RF pulses are repeatedly transmitted at a scan executed after the idling time, of the scans executed plural times, thereby transmitting the RF pulses repeatedly.

In anther aspect of the invention, there is provided a magnetic resonance imaging method of the present invention including the steps of executing by a phase cycling method, plural times, a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every time of repetition to the imaging area in which each of the spins is brought into the SSFP state during the idling time, and receiving magnetic resonance signals generated at the imaging area, generating images about the imaging area, based on the magnetic resonance signals received by executing the scan plural times, and changing the angle of the phase of each RF pulse during the idling time in such a manner that the angle thereof sequentially increases every time of repetition to a phase-increased angle at the time that the RF pulses are repeatedly transmitted at a scan executed after the idling time, of the scans executed plural times, thereby transmitting the RF pulses repeatedly.

In anther aspect of the invention, there is provided a scan apparatus of the present invention that executes, by a phase cycling method plural times, a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every time of repetition to the imaging area in which each of the spins is brought into the SSFP state during the idling time, and receiving magnetic resonance signals generated at the imaging area, wherein during the idling time, the angle of the phase of each RF pulse is changed so as to sequentially increase every time of repetition to a phase-increased angle at the time that the RF pulses are repeatedly transmitted at a scan executed after the idling time, of the scans executed plural times, thereby transmitting the RF pulses repeatedly.

In anther aspect of the invention, there is provided a program of the present invention for allowing a computer to function in such a manner that a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every time of repetition to the imaging area in which each of the spins is brought into the SSFP state during the idling time, and receiving magnetic resonance signals generated at the imaging area is performed plural times by a scan apparatus using a phase cycling method, wherein the program allows the computer to function in such a manner that the angle of each of the RF pulses is changed by the scan apparatus so as to sequentially increase every time of repetition to a phase-increased angle at the time that the RF pulses are repeatedly transmitted at a scan executed after the idling time, of the scans executed plural times, thereby transmitting the RF pulses repeatedly.

In anther aspect of the invention, there is provided a storage medium of the present invention that stores a program for allowing a computer to function in such a manner that a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every time of repetition to the imaging area in which each of the spins is brought into the SSFP state during the idling time, and receiving magnetic resonance signals generated at the imaging area, is performed plural times by a scan apparatus using a phase cycling method, wherein the storage medium stores a program for causing the computer to function in such a manner that the angle of each of the RF pulses is changed by the scan apparatus so as to sequentially increase every time of repetition to a phase-increased angle at the time that the RF pulses are repeatedly transmitted at a scan executed after the idling time, of the scans executed plural times, thereby transmitting the RF pulses repeatedly.

According to the invention, there can be provided a magnetic resonance imaging apparatus, a magnetic resonance imaging method, a scan apparatus, a program and a storage medium capable of enhancing imaging efficiency.

Further objects and advantages of the present invention will be apparent from the following description of the preferred embodiments of the invention as illustrated in the accompanying drawings.

BRIEF DESCRIPTION OF THE DRAWINGS

FIGS. 3(a) and 3(b) are diagrams showing the phases of RF pulses transmitted upon execution of scans in the embodiment according to the present invention.

DETAILED DESCRIPTION OF THE INVENTION

One example illustrative of an embodiment according to the present invention will hereinafter be explained with reference to the accompanying drawings.

(System Construction)

Figure 1:
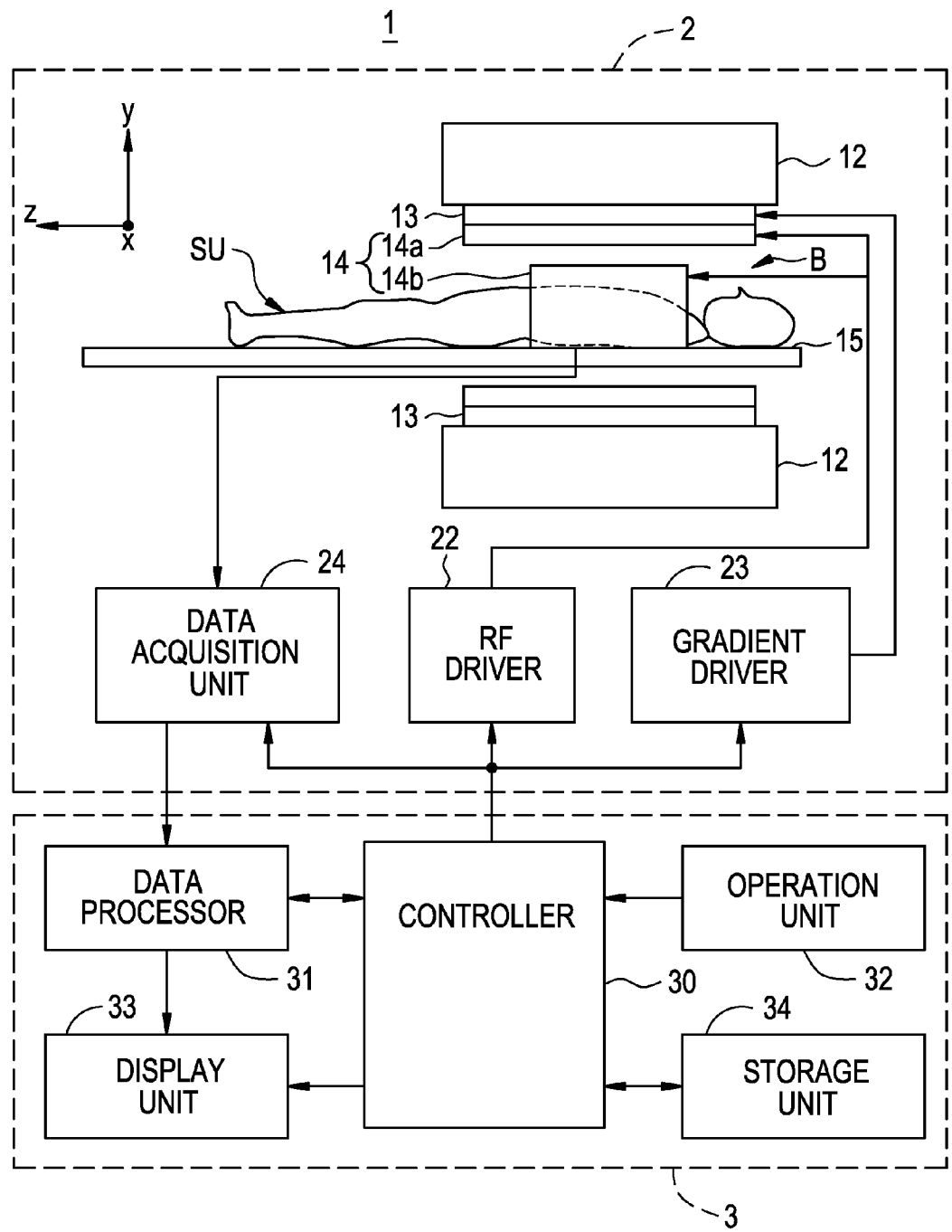
FIG. 1 is a configurational diagram showing a construction of a magnetic resonance imaging apparatus illustrative of an embodiment according to the present invention.

FIG. 1 is a configurational diagram showing a construction of a magnetic resonance imaging apparatus 1 illustrative of the embodiment according to the present invention.

As shown in FIG. 1, the magnetic resonance imaging apparatus 1 of the present embodiment has a scan section 2 and an operation console section 3. The scan section 2 performs a scan for transmitting an RF pulse to an imaging area of a subject in an imaging space B formed with a static magnetic field and obtaining a magnetic resonance signal generated at the imaging area to which the RF pulse has been transmitted. Thereafter, the operation console section 3 generates an image about the imaging area, based on the magnetic resonance signal obtained by the execution of the scan.

The scan section 2 will be explained.

As shown in FIG. 1, the scan section 2 has a static magnetic field magnet unit 12, a gradient coil unit 13, an RF coil unit or part 14, a cradle 15, an RF driver 22, a gradient driver 23 and a data acquisition unit 24. The scan section 2 effects a scan about the imaging area of the subject SU, based on a control signal outputted from the operation console section 3. Here, when the scan section 2 executes a scan, the RF coil unit 14 transmits an RF pulse so as to excite the spin of the imaging area of the subject SU placed on the cradle 15 within the imaging space B formed with the static magnetic field by the static magnetic field magnet unit 12, and the gradient coil unit 13 transmits a gradient pulse to the imaging area of the subject SU to which the RF pulse has been transmitted. And the RF coil unit 14 obtains a magnetic resonance signal generated at the imaging area of the subject SU.

In the present embodiment, a scan for, after the elapse of an idling time during which RF pulses are repeatedly transmitted every time of repetition (TR) in such a manner that the spin of the imaging area of the subject SU is brought into an SSFP state within the imaging space B, repeatedly transmitting the RF pulses every time of repetition (TR) to the imaging area of the subject SU at which the spin has been brought to the SSFP state during its idling time, and receiving a magnetic resonance signal generated at the imaging area, is executed plural times by a phase cycling method. When this scan is executed here, a gradient magnetic field is rewound in such a manner that a time integral value of the gradient magnetic field applied in each of a slice selection direction, a phase encode direction and a frequency encode direction is brought to zero within the time of repetition TR. That is, an SSFP pulse sequence for canceling all gradients during 1TR in the SSFP state is carried out by the phase cycling method.

Although described later in detail, the angle of the phase of each RF pulse is varied and each RF pulse is repeatedly transmitted, in such a manner that the angle of the phase is sequentially increased every time of repetition (TR) to a phase-increased angle at the time that each of the RF pulses is repeatedly transmitted at a scan executed after the idling time, of the scans executed plural times during the idling time.

Respective constituent elements of the scan section 2 will be explained sequentially.

The static magnetic field magnet unit 12 includes, for example, a superconductive magnet (not shown) and forms a static magnetic field in the imaging space B in which the subject SU is accommodated or held. Here, the static magnetic field magnet unit 12 forms the static magnetic field so as to extend along a body-axis direction (z direction) of the subject SU placed on the cradle 15. Incidentally, the static magnetic field magnet unit 12 may be constituted of a pair of permanent magnets.

The gradient coil unit 13 forms a gradient magnetic field in the imaging space B formed with the static magnetic field by the static magnetic field magnet unit 12 and applies or adds spatial position information to the magnetic resonance signal received by the RF coil unit 14. Here, the gradient coil unit 13 includes three systems set so as to correspond to three-axis directions of a z direction, an x direction and a y direction orthogonal to one another. These transmit gradient pulses in such a manner that a gradient magnetic field is formed in each of the frequency encode direction, phase encode direction and slice selection direction according to an imaging condition. Described specifically, the gradient coil unit 13 applies the gradient magnetic field in the slice selection direction of the subject SU and selects a slice of the subject SU excited by transmission of the RF pulse by the RF coil unit 14. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

The RF coil unit 14 transmits the RF pulse corresponding to an electromagnetic wave to its corresponding imaging area of the subject SU within the imaging space B formed with the static magnetic field by the static magnetic field magnet unit 12 to form a high frequency magnetic field, thereby exciting the spins of proton in the imaging area of the subject SU. The RF coil unit 14 receives an electromagnetic wave generated from the excited proton in the imaging area of the subject SU as a magnetic resonance signal. In the present embodiment, the RF coil unit 14 has a transmission coil 14a and a reception coil 14b as shown in FIG. 1. Here, the transmission coil 14a is of, for example, a bird cage type body coil and is disposed so as to surround the imaging area of the subject SU. On the other hand, the reception coil 14b is of a surface coil and receives the magnetic resonance signal.

The cradle 15 has a placement plane or surface. The subject SU is placed on the placement surface thereof. The cradle 15 is moves between the inside and outside of the imaging space B, based on a control signal supplied from the operation console section 3.

The RF driver 22 drives the RF coil unit 14 to transmit an RF pulse to within the imaging space B, thereby forming a high frequency magnetic field in the imaging space B. The RF driver 22 modulates a signal sent from an RF oscillator (not shown) to a signal having predetermined timing and predetermined envelope using a gate modulator (not shown) on the basis of the control signal outputted from the operation console section 3. Thereafter, the RF driver 22 allows an RF power amplifier (not shown) to amplify the signal modulated by the gate modulator and outputs the same to the RF coil unit 14, and allows the RF coil unit 14 to transmit the RF pulse.

The gradient driver 23 applies a gradient pulse to the gradient coil unit 13 based on the control signal outputted from the operation console section 3 to drive the gradient coil unit 13, thereby to generate a gradient magnetic field within the imaging space B formed with the static magnetic field. The gradient driver 23 has a three-system drive circuit (not shown) in association with the three-system gradient coil unit 13.

The data acquisition unit 24 acquires each magnetic resonance signal received by the RF coil unit 14 based on the control signal outputted from the operation console section 3. Here, the data acquisition unit 24 phase-detects the magnetic resonance signal received by the RF coil unit 14 using a phase detector (not shown) with the output of the RF oscillator (not shown) of the RF driver 22 as a reference signal. Thereafter, the data acquisition unit 24 converts the magnetic resonance signal corresponding to the analog signal into a digital signal by using an A/D converter (not shown) and outputs it therefrom.

The operation console section 3 will be explained.

As shown in FIG. 1, the operation console section 3 has a controller 30, a data processor 31, an operation unit 32, a display or display unit 33 and a storage unit 34.

Respective constituent elements of the operation console section 3 will be described sequentially.

The controller 30 has a computer and a memory that stores programs which allow the computer to execute predetermined data processing, and controls respective parts. Here, the controller 30 inputs operation data sent from the operation unit 32 and outputs the control signal to the RF driver 22, gradient driver 23 and data acquisition unit 24 respectively, based on the operation data inputted from the operation unit 32, thereby executing a predetermined scan. Along with it, the controller 30 outputs control signals to the data processor 31, display unit 33 and storage unit 34 to perform control on the respective parts.

In the present embodiment as described above, the controller 30 allows the computer to function by the corresponding program in such a manner that during the idling time at the time that the plural scans are executed in the SSFP pulse sequence by the phase cycling method, the phase is sequentially varied every time of repetition TR to the phase-increased angle where each of the RF pulses is repeatedly transmitted at the scan executed after the idling time, and the RF pulses are repeatedly transmitted, thereby controlling the scan section 2.

The data processor 31 has a computer and a memory that stores programs which execute predetermined data processing using the computer. The data processor 31 executes data processing, based on the control signal supplied from the controller 30. Here, the data processor 31 uses the magnetic resonance signal obtained by executing a scan by the scan section 2 as row data and generates images about the imaging area of the subject SU. Then, the data processor 31 outputs the generated image to the display unit 33. Described specifically, the magnetic resonance signals each acquired so as to correspond to a k space are inversely Fourier-transformed to reconstruct the images.

In the present embodiment, the data processor 31 reconstructs the images about the imaging area of the subject SU using the magnetic resonance signals respectively obtained by the plural scans executed by the phase cycling method as described above. The plural images are combined together by being subjected to, for example, add-averaging processing, thereby generating a combined image. The data processor 31 outputs the combined image to the display unit 33.

The operation unit 32 is constituted of an operation device such as a keyboard, a pointing device or the like. The operation unit 32 inputs operation data from an operator and outputs the same to the controller 30.

The display unit 33 is constituted of a display device such as a CRT and displays each image on its display screen, based on the control signal outputted from the controller 30. For example, the display unit 33 displays images about input items corresponding to the operation data inputted to the operation unit 32 by the operator on the display screen in plural form. Further, the display unit 33 receives data about each image of the subject SU generated based on the magnetic resonance signal from the subject SU from the data processor 31 and displays the image on the display screen.

The storage unit 34 includes a memory and stores various data therein. In the storage unit 34, the stored data are accessed by the controller 30 as needed.

(Operation)

A magnetic resonance imaging method for imaging or photographing an imaging area of a subject SU using the magnetic resonance imaging apparatus 1 according to the present embodiment will be explained below.

Figure 2:
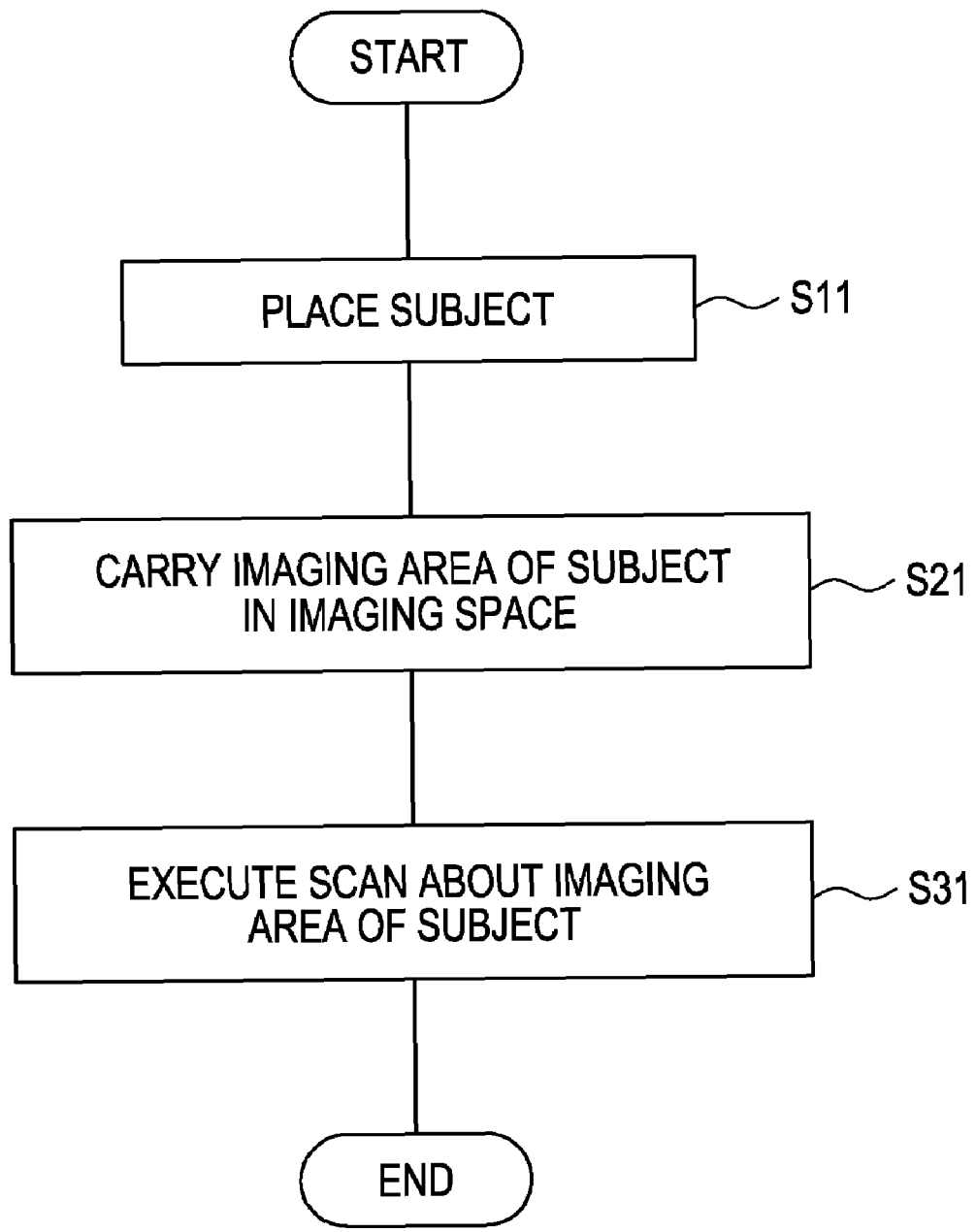
FIG. 2 is a flowchart showing operation of the magnetic resonance imaging apparatus illustrative of the embodiment according to the present invention at the time that an imaging area of a subject SU is photographed.

FIG. 2 is a flowchart showing operation of the magnetic resonance imaging apparatus illustrative of the embodiment according to the present invention, at the time that the imaging area of the subject SU is photographed.

As shown in FIG. 2, the subject SU is first placed (S11).

Here, the subject is placed on the placement surface of the cradle 15 (S11). After the reception coil 14b of the RF coil unit 14 has been installed or placed so as to correspond to the imaging area of the subject SU, the operation unit 32 outputs an operation signal to the controller 30 based on an imaging condition inputted to the operation unit 32 by the operator. Here, TR, TE, a flip angle α, etc. are inputted by the operator.

Next, as shown in FIG. 2, the imaging area of the subject SU is carried into an imaging space B (S21).

Here, the controller 30 controls the cradle 15 with the subject SU placed thereon on the basis of the imaging condition inputted to the operation unit 32 so as to move the cradle 15 to within the imaging space B formed with a static magnetic field.

Next, as shown in FIG. 2, a scan is effected on the imaging area of the subject SU (S31).

Here, a scan for transmitting RF pulses to the imaging area of the subject SU so as to excite spins in the imaging area of the subject SU within the imaging space B formed with the static magnetic field, and transmitting gradient pulses to the imaging area of the subject SU to which the RF pulses have been transmitted, thereby obtaining magnetic resonance signals generated at the subject SU, is executed.

In the present embodiment, an SSFP pulse sequence called "FISP, FIESTA or the like" is carried out so as to correspond or adapt to the phase cycling method thereby to execute a scan for the imaging area of the subject SU, whereby magnetic resonance signals are acquired.

That is, when the scan is executed, RF pulses are first repeatedly transmitted every time of repetition (TR) in such a manner that the spins in the imaging area of the subject SU are respectively brought into an SSFP state within the imaging space B formed with the static magnetic field during an idling time. That is, the RF pulses are idle-shot to form SSFP states. Thereafter, the phase of each RF pulse is increased every time of repetition (TR) so as to correspond to a phase-increased angle and the RF pulses are repeatedly transmitted to the imaging area at which the spins are brought into the SSFP state during the idling time, and magnetic resonance signals generated at the imaging area are received. That is, the acquisition of the magnetic resonance signals is carried out after the execution of the idle-shooting of the RF pulses.

The idle-shooting of the RF pulses and the acquisition of the magnetic resonance signals are repeated plural times so as to be associated with the added number of times (Nex).

In the present embodiment, during the idling time, the angle of the phase of each RF pulse is varied and the RF pulses are repeatedly transmitted, in such a manner that the angle of the phase of each RF pulse is sequentially increased every time of repetition TR to a phase-increased angle at the time that each of the RF pulses is repeatedly transmitted at a scan executed after the idling time.

Described specifically, during an idling time during which RF pulses of Ni times are repeatedly transmitted, RF pulses are repeatedly transmitted in such a manner that the phase of each RF pulse is sequentially linearly increased every time of repetition (TR) at an angle $\Delta\Phi$ expressed in the following equation (1) at the early stage of the idling time during which RF pulses of Ni1 times are repeatedly transmitted.

$$\Delta\Phi = \Phi1 + n(\Phi2 - \Phi1)/Ni1 \qquad (1)$$

Here, in the equation (1), $\Phi1$ indicates a phase-increased angle at the time that RF pulses are repeatedly transmitted at a scan executed before the idling time, of the scans executed plural times. $\Phi2$ indicates a phase-increased angle at the time that RF pulses are repeatedly transmitted at a scan executed after the idling time, of the scans executed plural times. Ni1 indicates the number of times that the phase is sequentially increased at the early stage of the idling time and the RF pulses are repeatedly transmitted. n indicates an integer expressed in n=0, 1, 2, 3, ..., Ni1 and corresponds to the order of transmitting the RF pulses repeatedly during the idling time.

At a subsequent-stage portion of an idling time during which RF pulses of Ni2 times are repeatedly transmitted, the phase of each RF pulse is increased at a phase-increased angle at the time that the RF pulses are repeatedly transmitted at a scan executed after the idling time, to transmit the RF pulses.

FIG. 3 is a diagram showing the phases of RF pulses transmitted upon execution of scans in the embodiment according to the present invention. FIG. 3 shows a case in which the added number of times is 3Nex. FIG. 3(a) indicates a 1Nexth, and FIG. 3(b) indicates a 2Nexth.

As shown in FIG. 3(a), a first scan S1 is first executed.

Here, the first scan S1 is carried out assuming that the phase-increased angle corresponding to the angle of each phase increased every TR is $\Phi1=0°$.

Described specifically, as shown in FIG. 3, RF pulses are repeatedly transmitted in such a manner that the phase $\Phi$ of an RF pulse at each TR is transitioned or shifted to 0°, 0°, 0°, 0°, ... sequentially during an idling time Ti1, thereby forming SSFP states.

As shown in FIG. 3, RF pulses are repeatedly transmitted in such a manner that the phase $\Phi$ of the RF pulse at each TR is transitioned to 0°, 0°, 0°, 0°, ... sequentially during a data acquisition period Ta1 during which magnetic resonance signals are acquired.

Next, as shown in FIG. 3(b), a second scan S2 is executed.

Here, as shown in FIG. 3(b), RF pulses are sequentially transmitted every TR in such a manner that during an initial Ti2s of an idling time at which RF pulses of Ni1 times (e.g., Ni1=12) are repeatedly transmitted during an idling time Ti2 at which RF pulses of Ni times are repeatedly transmitted, the angle of the phase of each RF pulse is increased according to the transmission order n of the RF pulses transmitted at the idling time Ti2, at an angle $\Delta\Phi$ obtained by, as expressed in the equation (1), adding a value obtained by dividing, by a repetition number Ni (Ni1=12), a value of difference between the phase-increased angle $\Phi1$ ($\Phi1=0°$) and a phase-increased angle $\Phi2$ ($\Phi2=120°$) at the time that RF pulses are repeatedly transmitted at the second scan S2 executed after the idling time Ti2.

Described specifically, as shown in FIG. 3(b), the phase-increased angle is increased every 10° to reach the phase-increased angle ($\Phi2=120°$) at which the phase is increased upon acquisition of magnetic resonance signals after the idling time Ti2, as in the case where $\Delta\Phi$ is 10°, 20°, 30°, ..., 120°, and the RF pulses are repeatedly transmitted.

That is, when an RF pulse is transmitted at the first time (n=1) during the initial Ti2s of the idling time, the RF pulse is sent with the phase as 10° corresponding to an increase of 10°. Upon transmitting an RF pulse at the second time (n=2), the RF pulse is transmitted with the phase as 30° corresponding to an increase of 30° with respect to the first time (n=1). Upon transmitting an RF pulse at the third time (n=3), the RF pulse is transmitted with the phase as 60° corresponding to an increase of 30° with respect to the second time (n=2). Thus, each individual RF pulse is transmitted while the phase of the RF pulse is being transitioned to 10°, 30°, 60°, 100°, 150°, 210°, 280°, 360°, 450°, 550°, 660° and 780° sequentially.

During a subsequent stage Ti2e of the idling time Ti2, the phase of each RF pulse is sequentially increased every 120° as in the case of 900°, 1020°, 1140°, ... at a phase-increased angle ($\Phi2=120°$) at which the RF pulses are repeatedly transmitted during a data acquisition period executed after the idling time Ti2, to transmit the RF pulses, whereby the spins in the imaging area of the subject SU are brought into the SSFP state.

Thereafter, upon acquisition of the magnetic resonance signals, the phase of an RF pulse at each TR is sequentially increased every 120° like 0°, 120°, 240°, ... so as to correspond to the phase-increased angle ($\Phi2=120°$) defined by the phase cycling method, and the RF pulses are repeatedly transmitted.

Next, a third scan S3 is executed.

Although the illustration of the third scan S3 is omitted here because it is similar to the second scan S2, RF pulses are sequentially transmitted every TR in such a manner that during an initial Ti3s of an idling time at which RF pulses of Ni1 times are repeatedly transmitted during an idling time Ti3 at which RF pulses of Ni times are repeatedly transmitted, the angle of the phase of each RF pulse is increased according to the transmission order n of the RF pulses transmitted at the idling time Ti3, at an angle $\Delta\Phi$ obtained by, as expressed in the equation (1), adding a value obtained by dividing, by a repetition number Ni (Ni1=12), a value of difference between the phase-increased angle Φ1 (Φ1=120°) and a phase-increased angle Φ2 (Φ2=240°) at the time that RF pulses are repeatedly transmitted at the third scan S3 executed after the idling time Ti3.

During a subsequent stage Ti3e of the idling time Ti3, the phase of each RF pulse is increased at a phase-increased angle (Φ2=240°) at which the RF pulses are repeatedly transmitted during a data acquisition period executed after the idling time Ti3 to transmit the RF pulses, whereby the spins in the imaging area of the subject SU are brought into the SSFP state.

Thereafter, upon acquisition of the magnetic resonance signals, the phase of the RF pulse at each TR is sequentially increased every 240° so as to correspond to the phase-increased angle (Φ2=240°) defined by the phase cycling method, and in this condition, the RF pulses are thus transmitted repeatedly.

After the scan has been carried out plural times in the SSFP pulse sequence by the phase cycling method as described above, the data processor 31 generates images about the imaging area of the subject SU, based on the magnetic resonance signals acquired by the data acquisition unit 24 at the respective scans.

Here, the data processor 31 reconstructs the images about the imaging area of the subject SU using the magnetic resonance signals obtained by the plural scans executed by the phase cycling method. The plural images reconstructed so as to correspond to the respective scans are combined together by being subjected to add-averaging processing every pixel to generate a combined image.

The display unit 33 displays the combined image generated by the data processor 31 on its display screen. The photography or imaging about the imaging area of the subject SU is completed in this way.

In the present embodiment as described above, the angle of the phase of each RF pulse is changed in such a manner that during the idling time at which the spins are transitioned to the SSFP state upon execution of the SSFP pulse sequence by the phase cycling method, the phase angle is sequentially increased every time of repetition (TR) to the phase-increased angle at the time that the RF pulses are repeatedly transmitted at the scan executed after the idling time, thereby transmitting the RF pulses repeatedly.

Figure 4A:
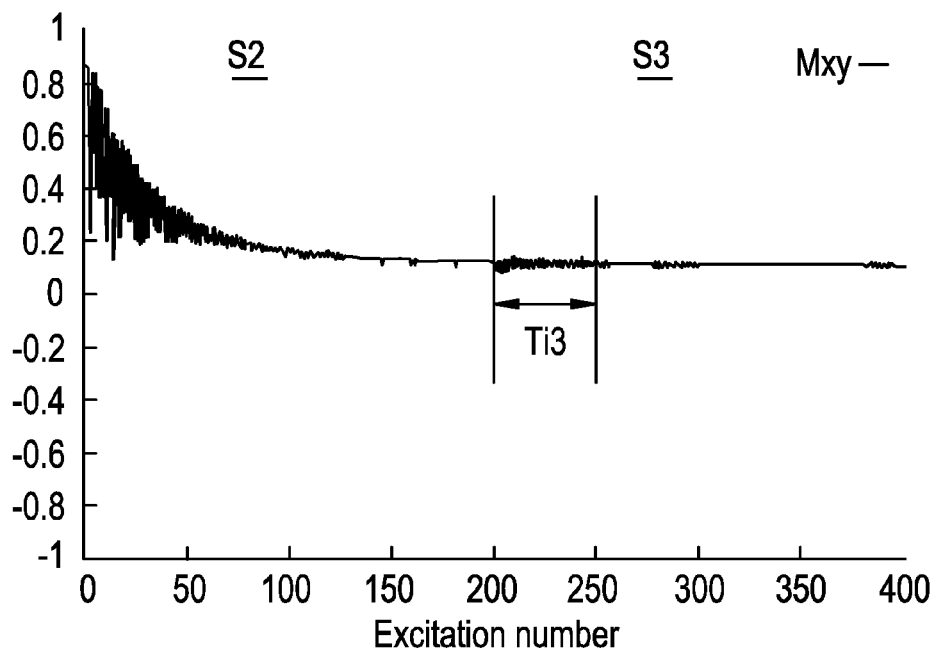
FIGS. 4(a) and 4(b) are diagrams illustrating a simulation result obtained by simulating the behaviors of magnetization Mxy in the embodiment according to the present invention.
Figure 4B:
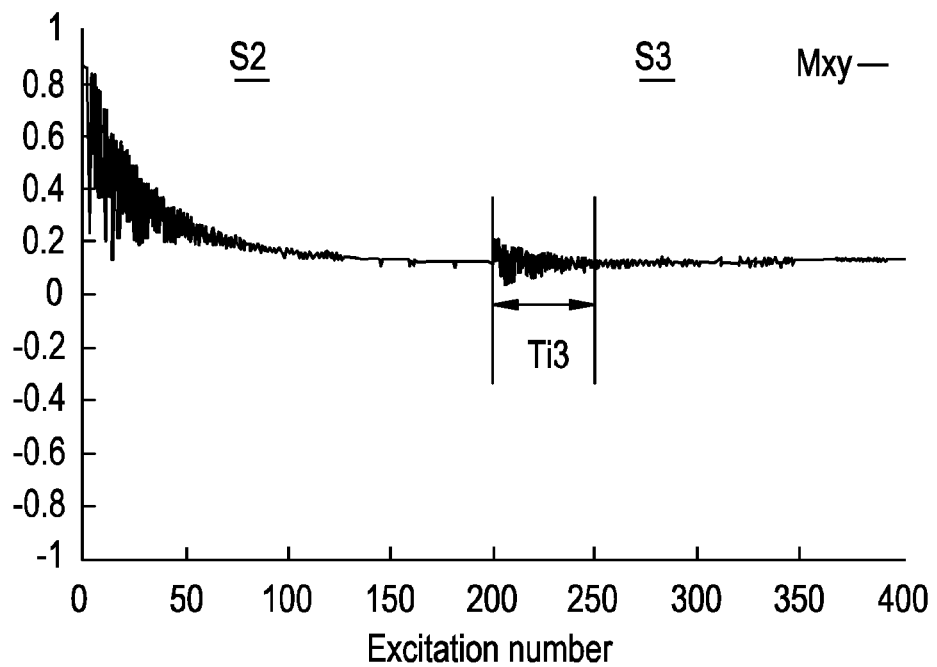
Figure 5A:
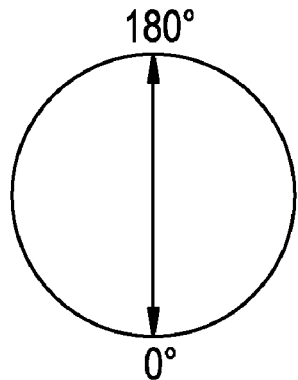
FIGS. 5(a), 5(b), and 5(c) are diagrams showing increased angles of phases of transmitted RF pulses at a phase cycling method.
Figure 5B:
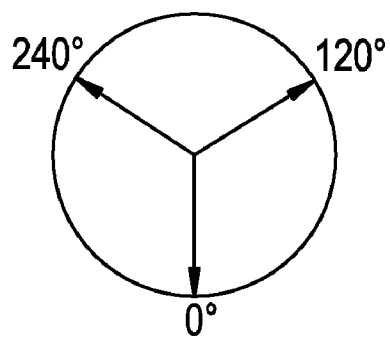
Figure 5C:
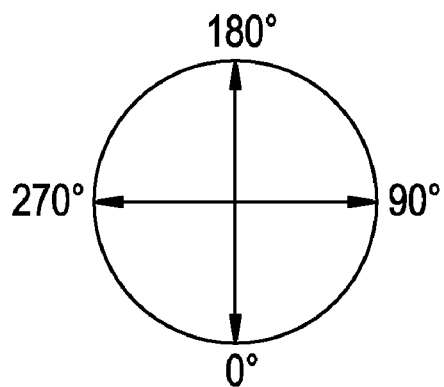

FIG. 4 is a diagram illustrating a simulation result obtained by simulating the behaviors of magnetization Mxy in the embodiment according to the present invention. FIG. 4(a) shows a case in which the phase of an RF pulse is increased as expressed in the equation (1) in the present embodiment, and FIG. 4(b) shows a conventional case. FIG. 4 shows portions where in the case of 3Nex as mentioned above, the second scan S2 for transmitting the RF pulses with the phase-increased angle as 120° and the third scan for transmitting the RF pulses with the phase-increased angle as 240° are executed after execution of the first scan S1 for transmitting the RF pulses with the phase-increased angle as 0°. The horizontal axis indicates an excitation number, and the vertical axis indicates a signal of Mxy, respectively.

It is understood that during the idling time Ti3 at the third scan S3 as shown in FIG. 4, the amplitude of the signal is small and the SSFP state is reached faster in the case of the present embodiment as compared with the conventional case.

Thus, since the number of times that the RF pulses are idle-shot during the idling time can be reduced, imaging can be carried out efficiently in the present embodiment.

Incidentally, the present invention is not limited to the above embodiment upon its implantation. Various modifications can be adopted.

Although the present embodiment has shown, for example, the case in which the RF pulses are repeatedly transmitted during the idling time in such a manner that the increase of the phase is linearly increased every time of repetition (TR), the present invention is not limited to it. For example, the RF pulses may repeatedly be transmitted during the idling time in such a manner that the increase of the phase is increased in a curved form.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus comprising: a controller and scan device that executes, by a phase cycling method plural times, a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every said time of repetition to the imaging area in which each of the spins is brought into the SSFP state during the idling time, and receiving magnetic resonance signals generated at the imaging area, and that generates images about the imaging area, based on the magnetic resonance signals received by executing the scan plural times, wherein the scan device changes the angle of the phase of each RF pulse so as to sequentially increase every said time of repetition to a phase-increased angle at the time that the RF pulses are repeatedly transmitted at a scan executed after the idling time, of the scans executed plural times, thereby transmitting the RF pulses repeatedly.

2. The magnetic resonance imaging apparatus according to claim 1, wherein the scan device sequentially increases the phase of each of the RF pulses every said time of repetition at an angle ΔΦ expressed in the following equation (1) upon repeatedly transmitting the RF pulses during the idling time:

$$\Delta\Phi=\Phi 1+n(\Phi 2-\Phi 1)/Ni1 \quad (1),$$

where Φ1 indicates a phase-increased angle at the time that the RF pulses are repeatedly transmitted at the scan executed before the idling time, of the scans executed plural times, Φ2 indicates a phase-increased angle at the time that the RF pulses are repeatedly transmitted at the scan executed after the idling time, of the scans executed plural times, Ni1 indicates the number of times that the phase is sequentially increased at the early stage of the idling time and the RF pulses are repeatedly transmitted, and n indicates an integer expressed in n=1, 2, 3, . . . , Ni1 and corresponds to the order of transmitting the RF pulses repeatedly during the idling time.

3. The magnetic resonance imaging apparatus according to claim 2, wherein when the scan is executed, the scan device rewinds a gradient magnetic field in such a manner that a time integral value of the gradient magnetic field applied in each of a slice selection direction, a phase encode direction and a frequency encode direction is brought to zero within the time of repetition.

4. The magnetic resonance imaging apparatus according to claim 2, further including a display unit for displaying the images about the imaging area.

5. The magnetic resonance imaging apparatus according to claim 1, wherein when the scan is executed, the scan device rewinds a gradient magnetic field in such a manner that a time integral value of the gradient magnetic field applied in each of a slice selection direction, a phase encode direction and a frequency encode direction is brought to zero within the time of repetition.

6. The magnetic resonance imaging apparatus according to claim 5, further including a display unit for displaying the images about the imaging area.

7. The magnetic resonance imaging apparatus according to claim 1, further including a display unit for displaying the images about the imaging area.

8. A magnetic resonance imaging method comprising the steps of:

executing by a phase cycling method, plural times, a scan for, after the elapse of an idling time during which RF pulses are repeatedly transmitted every time of repetition in such a manner that spins in an imaging area of a subject are respectively brought into an SSFP state in a static magnetic field space, repeatedly transmitting the RF pulses every said time of repetition to the imaging area in which each of the spins is brought into the SSFP state during the idling time, and receiving magnetic resonance signals generated at the imaging area, generating images about the imaging area, based on the magnetic resonance signals received by executing the scan plural times, and changing the angle of the phase of each RF pulse during the idling time in such a manner that the angle thereof sequentially increases every said time of repetition to a phase-increased angle at the time that the RF pulses are repeatedly transmitted at a scan executed after the idling time, of the scans executed plural times, thereby transmitting the RF pulses repeatedly.

9. The magnetic resonance imaging method according to claim 8, further including a step of:

sequentially increasing the phase of each of the RF pulses every said time of repetition at an angle $\Delta\Phi$ expressed in the following equation (1) upon repeatedly transmitting the RF pulses during the idling time:

$$\Delta\Phi=\Phi 1+n(\Phi 2-\Phi 1)/Ni1 \qquad (1),$$

where $\Phi 1$ indicates a phase-increased angle at the time that the RF pulses are repeatedly transmitted at the scan executed before the idling time, of the scans executed plural times, $\Phi 2$ indicates a phase-increased angle at the time that the RF pulses are repeatedly transmitted at the scan executed after the idling time, of the scans executed plural times, Ni1 indicates the number of times that the phase is sequentially increased at the early stage of the idling time and the RF pulses are repeatedly transmitted, and n indicates an integer expressed in n=1, 2, 3, ..., Ni1 and corresponds to the order of transmitting the RF pulses repeatedly during the idling time.

10. The magnetic resonance imaging method according to claim 8, further including a step of:

upon executing the scan, rewinding a gradient magnetic field in such a manner that a time integral value of the gradient magnetic field applied in each of a slice selection direction, a phase encode direction and a frequency encode direction is brought to zero within the time of repetition.

11. The magnetic resonance imaging method according to claim 8, further including a step of:

displaying the images about the imaging area.

12. A scan apparatus comprising: a controller connected to the scan device that executes, by a phase cycling method plural times, a scan for, after the elapse of an idling time during which RF pulses are repeatedly transmitted every said time of repetition in such a manner that spins in an imaging area of a subject are respectively brought into an SSFP state in a static magnetic field space, repeatedly transmitting the RF pulses every said time of repetition to the imaging area in which each of the spins is brought into the SSFP state during the idling time, and receiving magnetic resonance signals generated at the imaging area, wherein during the idling time, the angle of the phase of each RF pulse is changed so as to sequentially increase every said time of repetition to a phase-increased angle at the time that the RF pulses are repeatedly transmitted at a scan executed after the idling time, of the scans executed plural times, thereby transmitting the RF pulses repeatedly.

13. The scan apparatus according to claim 12, wherein when the RF pulses are repeatedly transmitted during the idling time, the phase of each of the RF pulses is sequentially increased every said time of repetition at an angle $\Delta\Phi$ expressed in the following equation (1):

$$\Delta\Phi=\Phi 1+n(\Phi 2-\Phi 1)/Ni1 \qquad (1),$$

where $\Phi 1$ indicates a phase-increased angle at the time that the RF pulses are repeatedly transmitted at the scan executed before the idling time, of the scans executed plural times, $\Phi 2$ indicates a phase-increased angle at the time that the RF pulses are repeatedly transmitted at the scan executed after the idling time, of the scans executed plural times, Ni1 indicates the number of times that the phase is sequentially increased at the early stage of the idling time and the RF pulses are repeatedly transmitted, and n indicates an integer expressed in n=1, 2, 3, ..., Ni1 and corresponds to the order of transmitting the RF pulses repeatedly during the idling time.

14. The scan apparatus according to claim 12, wherein when the scan is executed, a gradient magnetic field is rewound in such a manner that a time integral value of the gradient magnetic field applied in each of a slice selection direction, a phase encode direction and a frequency encode direction is brought to zero within the time of repetition.

15. A controller connected to a scan device having a program for allowing a computer in the controller to execute the steps comprising: after the elapse of an idling time, RF pulses are repeatedly transmitted every time of repetition in such a manner that spins in an imaging area of a subject are respectively brought into an SSFP state in a static magnetic field space, repeatedly transmitting the RF pulses every said time of repetition to the imaging area in which each of the spins is brought into the SSFP state during the idling time, and receiving magnetic resonance signals generated at the imaging area is performed plural times by a scan apparatus using a phase cycling method, wherein said program allows the computer to function in such a manner that the angle of each of the RF pulses is changed by the scan apparatus so as to sequentially increase every said time of repetition to a phase-increased angle at the time that the RF pulses are repeatedly transmitted at a scan executed after the idling time, of the scans executed plural times, thereby transmitting the RF pulses repeatedly and generating images about the imaging area, based on the magnetic resonance signals received by executing the scan plural times.

16. The controller according to claim 15, wherein the computer is allowed to function in such a manner that when the RF pulses are repeatedly transmitted during the idling time, the phase of each of the RF pulses is sequentially increased every said time of repetition at an angle $\Delta\Phi$ expressed in the following equation (1):

$$\Delta\Phi=\Phi 1+n(\Phi 2-\Phi 1)/Ni1 \qquad (1),$$

where $\Phi 1$ indicates a phase-increased angle at the time that the RF pulses are repeatedly transmitted at the scan executed before the idling time, of the scans executed plural times, $\Phi 2$ indicates a phase-increased angle at the time that the RF pulses are repeatedly transmitted at the scan executed after the idling time, of the scans executed plural times, Ni1 indicates the number of times that the phase is sequentially increased at the early stage of the idling time and the RF pulses are repeatedly transmitted, and n indicates an integer expressed in n=1, 2, 3, ..., Ni1 and corresponds to the order of transmitting the RF pulses repeatedly during the idling time.

17. The controller according to claim 16, wherein the computer is allowed to function in such a manner that when the scan is executed, a time integral value of a gradient magnetic field applied in each of a slice selection direction, a phase encode direction and a frequency encode direction is brought to zero within the time of repetition, and the gradient magnetic field is rewound by the scan apparatus.

18. A controller connected to a scan device having a storage medium that stores a program for allowing a computer in the controller to after the elapse of an idling time RF pulses are repeatedly transmitted every said time of repetition in such a manner that spins in an imaging area of a subject are respectively brought into an SSFP state in a static magnetic field space, repeatedly transmitting the RF pulses every said time of repetition to the imaging area in which each of the spins is brought into the SSFP state during the idling time, and receiving magnetic resonance signals generated at the imaging area, is performed plural times by a scan apparatus using a phase cycling method, wherein said storage medium stores a program for causing the computer to function in such a manner that the angle of each of the RF pulses is changed by the scan apparatus so as to sequentially increase every said time of repetition to a phase-increased angle at the time that the RF pulses are repeatedly transmitted at a scan executed after the idling time, of the scans executed plural times, thereby transmitting the RF pulses repeatedly and generating images about the imaging area based on the magnetic resonance signals received by executing the scan plural times.

19. A controller according to claim 18, which stores a program for allowing the computer to function in such a manner that when the RF pulses are repeatedly transmitted during the idling time, the phase of each of the RF pulses is sequentially increased every said time of repetition at an angle $\Delta\Phi$ expressed in the following equation (1):

$$\Delta\Phi=\Phi 1+n(\Phi 2-\Phi 1)/Ni1 \qquad (1),$$

where $\Phi 1$ indicates a phase-increased angle at the time that the RF pulses are repeatedly transmitted at the scan executed before the idling time, of the scans executed plural times, $\Phi 2$ indicates a phase-increased angle at the time that the RF pulses are repeatedly transmitted at the scan executed after the idling time, of the scans executed plural times, Ni1 indicates the number of times that the phase is sequentially increased at the early stage of the idling time and the RF pulses are repeatedly transmitted, and n indicates an integer expressed in n=1, 2, 3, ..., Ni1 and corresponds to the order of transmitting the RF pulses repeatedly during the idling time.

20. A controller according to claim 19, which stores a program for allowing the computer to function in such a manner that when the scan is executed, a time integral value of a gradient magnetic field applied in each of a slice selection direction, a phase encode direction and a frequency encode direction is brought to zero within the time of repetition, and the gradient magnetic field is rewound by the scan apparatus.

* * * * *